United States Patent
Delatorre

Patent Number: 5,095,763
Date of Patent: Mar. 17, 1992

[54] LOAD-SENSITIVE RESONATOR BEAM TRANSDUCER

[76] Inventor: Leroy C. Delatorre, 130 Industrial Blvd., Sugar Land, Tex. 77478

[21] Appl. No.: 620,654

[22] Filed: Dec. 3, 1990

[51] Int. Cl.$^5$ ............................................. G01L 1/10
[52] U.S. Cl. .................................. 73/862.59; 73/704; 73/778
[58] Field of Search ............ 73/702, 704, 778, 862.59, 73/DIG. 1

[56] References Cited

U.S. PATENT DOCUMENTS

| | | | |
|---|---|---|---|
| 4,594,898 | 6/1986 | Kirman et al. | 73/778 |
| 4,872,343 | 10/1989 | Peters et al. | 73/862.59 |
| 4,912,990 | 4/1990 | Norling | 73/862.59 |
| 4,970,903 | 11/1990 | Hanson | 73/862.59 |

Primary Examiner—Donald O. Woodiel
Attorney, Agent, or Firm—Marvin J. Marnock

[57] ABSTRACT

A vibratory force transducer comprising a vibratory beam (21) of rectangular transverse cross section having a uniform thickness t, a major span section of length $L_1$ and width $w_1$, and at least one end of the major span having an adjoining tab of greater width $W_2$ and length $L_s$. The beam is driven by electrical excitation to vibrate at resonant frequency in a given direction. The tab provides the beam with an effective length which is a function of length of the beam sections and their moments of inertia in the given direction and a criterion by which t, $w_1$, $L_1$ and $L_s$ are selected such that resonant frequency and higher harmonic modes of the beam in the given direction are different from the resonant frequency and higher harmonics in any other direction. The transducer may comprise dual beams (31,32) as a double-ended tuning fork with moment decoupling number (45) at the joined end. For each beam comprising a major span of length $L_1$ and adjoining tab, an effective length is determinable using $L_1$, $L_s$ and moments of inertia in a given direction of vibration as a criterion by which t, $w_1$, $L_1$ and $L_s$ are selected to avoid spurious out-of-phase oscillation in other directions. An effective length for a length $L_3$ of the transducer which includes the decoupling member is determinable from $L_1$, $L_s$ and $L_3$ and moments of inertia as a criterion for selection of t, $w_1$, $W_2$, $L_1$ and $L_s$ for avoiding spurious in-phase vibration perpendicular to the given direction.

11 Claims, 3 Drawing Sheets

LS=L2−L1
LS=LS1+LS2

LOAD-SENSITIVE RESONATOR BEAM TRANSDUCER

The invention relates to load-sensitive vibratory transducers, and more particularly to load-sensitive vibratory transducers which include a vibratory beam member with an approximately rectangular cross section.

Load-sensitive transducers of the type which include a vibratory beam as the force sensitive element are in wide application. In such transducers a vibratory beam is mounted such that a tensile or compressive force to be sensed is applied at an end of the beam in a manner to axially stress the beam. In response to the axial stress, the beam's natural frequency of vibration changes in relation to the magnitude of the applied stress. When the load-sensitive beam is vibrated at its natural resonant frequency by electrical excitation, a detected shift in frequency which increases under tensile loading and decreases under compressive loading, is representative of the magnitude of an externally applied load.

For obtaining an accurate measurement of applied load, it is important that the vibration frequency of the vibratory member be a true and accurate representation of the axial stress applied to it. In this regard, the natural frequency of a beam is determined primarily by its dimensions and the kind of material from which it is made, although it is also influenced by temperature and the medium in which it operates.

It is difficult, however, to mount the vibrating member in a way which will not seriously degrade its vibration frequency performance. A single beam resonator which is directly coupled to the mounting supporting structure will be affected by any structural resonances of the support member to which it is mounted. It will also be sensitive to external vibrations imposed on the mounting support structures at any of the support structure resonant frequencies. Its temperature coefficient of frequency also will be affected by the temperature coefficient of the supporting structures. There is also the potential for energy loss at the mounting interface which, ideally, resists the forces and moments generated by the vibrating beam. Any such loss results in a decrease in the quality factor "Q" of the resonator, that is, the ratio of energy stored to the energy lost, and a consequent degradation of frequency stability of the resonator.

The double vibrating beam resonator, wherein two vibrating members are mounted parallel to one another and vibrated in relative 180° phase opposition for the purpose of canceling end effects on the mounting structure, has been devised for overcoming the above noted disadvantages of a single beam transducer. Such double beam resonators, however, have other associated difficulties. If the two beams are not loaded equally, the frequency shift due to the externally applied load will be unequal such that there will be two resonant peak frequencies for the device rather than one and consequently change the frequency versus load characteristics. In addition, there must be a very close matching of the physical dimensions of the two vibrating beams if the beneficial canceling effects are to be obtained. The possible development of spurious modes of oscillation is also a problem with the double-beam vibratory transducer. Such overtone frequencies can cause flexure of the vibratory beams in a direction which is different from the desired plane of vibration with the beams vibrating in phase or 180° out of phase. As acoustic energy transfers from the desired resonant mode to the spurious modes, there will be a "dead" region of operation where the transducer will measure incorrectly or possibly not measure at all. The development of spurious modes of oscillation, which can also be an affliction of single beam transducers, seriously degrades the mechanical "Q" of these devices.

BACKGROUND PATENT ART

U.S. Pat. No. 4,372,173 relates to the selection of beam dimensions for avoiding the development of spurious modes of oscillation in both single beam and double beam vibratory transducers. For a transducer beam having a thickness "t", width "w", length "1", and distance "m" between the locations at which the beam ends are coupled together, the ratios "t/w" and "1/m" must be selected so that the desired characteristic resonant frequency "f" and multiples thereof for the transducer, do not equal one of the spurious mode resonant frequencies anywhere in the operating range, i.e. for any sensitivity values in the desired range of sensitivity of the force transducer. Sensitivity of a transducer is its ability to detect changes in an applied force F and can be defined as the fractional change in frequency with applied force. To achieve high sensitivity, the patent discloses "t" and "w" should be selected in the range such that $0.4 < t/w < 4$ although certain values of t/w in this range including $t=w$ are precluded. For minimum stress consistent with maximum sensitivity, however, t/w should be chosen to be as large as possible. This specifies values of t which are greater than w, but in practice, it is not practical to fabricate a beam transducer by photo-etching with values of $t > w$.

While quartz, a prezoelectric material, is widely used in vibratory beam transducers because of demonstrated high mechanical "Q", dimensional stability, good elastic characteristics, and low temperature coefficient of expansion, its disadvantages pertaining to fragility, and difficulty to produce and handle in small dimensional sensors has led to the development and use of metal vibratable beams in resonator transducers. Such beams can be fabricated by an electro-etching process with great accuracy for very small dimensional transducers.

There are also many transducers which are used in applications where only tensile forces are axially applied to the vibrating beam and problems associated with "buckling" of the beam are not present. Considerably superior transducers can then be designed when design restrictions for avoiding buckling are eliminated.

SUMMARY OF THE INVENTION

The invention is embodied in a vibratory force transducer as shown in FIG. 2 and comprising an elongate vibratory beam which is rectangular in transverse cross section and characterized by a uniform thickness t, a major span section of length $L_1$ and a width $w_1$ in transverse cross section, and at least one end of the major span having a tab section of greater width joined thereto. The tab section which is of a length $L_s < L_1$, provides the beam with a different moment of inertia for different directions of vibration such that the effect is to change resonant frequency by differing amounts in differing directions of vibration. The provision of a tab section also provides the beam with an effective length which is a function of the lengths of the beam sections and the moments of inertia of the beam sections for vibration in a give direction. An additional degree of freedom of design is thus presented by the provision of a tab section for a vibratory beam which allows a selection of $t=w_1$ for the major span section while maintaining different resonant frequencies of the beam for different directions. The beam is adapted to be caused to resonate by means of electrical excitation at a frequency $f_1$ in a given transverse direction and t, $w_1$, $L_1$ and $L_s$ are selected to avoid spurious modes of oscillation such that the resonant frequency of the beam in the given transverse direction for operations is different from the natural resonant frequency and higher harmonic modes of the beam in any other direction.

The transducer of the invention may also comprise dual beams joined as a double-ended tuning fork, each of which includes a major span section of thickness t, length $L_1$, width $w_1$ and provided on at least one end with a tab section of width $w_2 > w_1$ and length $L_s < L_1$. The beams are joined at one end which forms a common coupled section and a moment decoupling member is incorporated at the end of the common section for decoupling load moments from a support structure as well as allowing the common section to rotate to compensate for length mismatch of the beams. For each beam, an effective length may be determined using the values $L_1$ and $L_s$ and the included moments of inertia for the beam sections as a criterion from which t, w, $L_1$ and $L_s$ are selected to avoid spurious out of phase oscillation of the beams in the direction perpendicular to the given transverse direction for operations. An effective length for an overall length $L_3$ which includes an end attached moment decoupling member is also determinable from $L_1$, $L_s$ and $L_3$ and the included sections moments of inertia as a further criterion for selection of t, w, $L_1$ and $L_s$ for avoiding a spurious mode of vibration of the beams in the direction perpendicular to the normal operational transverse direction of vibration but wherein the beams vibrate in phase and in the same plane.

DETAILED DESCRIPTION OF THE INVENTION

Figure 1:
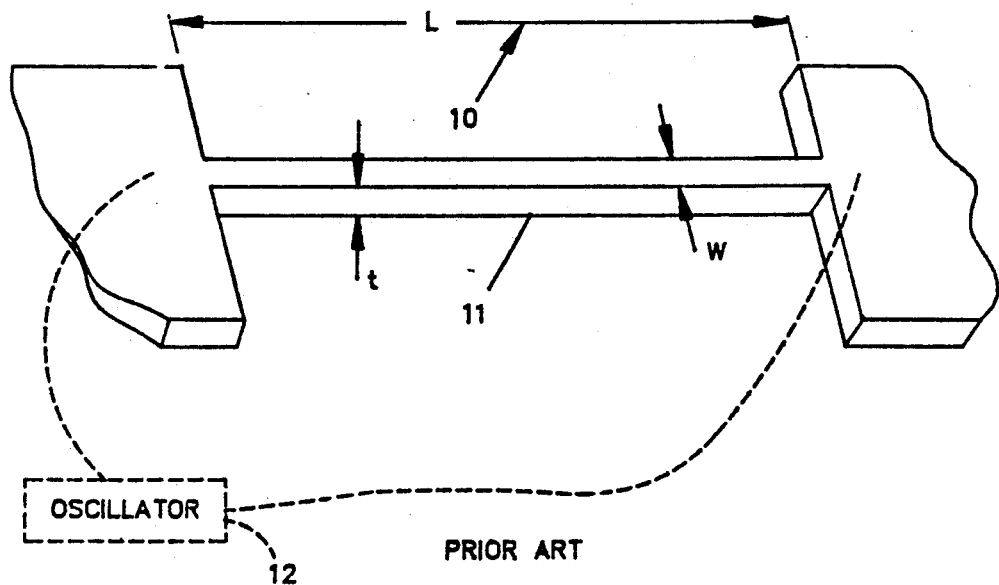
FIG. 1 is a perspective view of a conventional single beam resonant transducer, the beam of which is mounted to a support at both ends.

The natural frequency f of a straight structural beam of length L and width w which is clamped at both ends can be expressed as $$\omega_n = k^2 \sqrt{\frac{E J g}{A \gamma}} \tag{1}$$

This equation is derived in the Shock Vibration Handbook by Cyril M. Harris, Third Edition. 1988, McGraw Hill Book Company. In equation (1),
  E = modulus of elasticity
  I = moment of inertia in the direction of vibration
  A = cross section area
  $\gamma$ = weight density
  $\omega_n = 2\pi f$
  k = 4.730

$$\left(\frac{1}{L}\right)$$

for the natural frequency
  g = acceleration due to gravity
  For the first, second and third harmonic modes, $$k = 7.853 \left(\frac{1}{L}\right), 10.996 \left(\frac{1}{L}\right), \text{ and } 14.137 \left(\frac{1}{L}\right),$$

respectively. Additionally, the effect on frequency of an axial load F applied to the beam is given (see Shock Vibration Handbook, page 7-18, supra) as $$\omega_n = \omega_o \left(1 \pm \frac{a^2}{4n^2}\right)^{\frac{1}{2}} \tag{2}$$

where $a^2 = \dfrac{F L^2}{E I \pi^2}$ and $$\text{sensitivity} = S = \left(1 + \frac{a^2}{4n^2}\right)^{\frac{1}{2}} - 1$$

and the factor $\frac{1}{4}$ is introduced for a beam with clamped ends. In equation (2), n = harmonic mode number with n = 1 for the natural resonant frequency, the plus sign is for a tensile force and the minus sign is for a compressive force.

By use of equations (1) and (2), a natural frequency f can be calculated for the beam in a desired direction of vibration, using the value of I of the beam for that direction and an effective length $L_e$ to be described herein, which is useful for a beam having non-symmetrical dimensions, as when the beam is provided at one end with a tab section of greater width than the remaining length of beam. The effect of a tab section on resonant frequency of a beam can be calculated using a relatively complex mathematical derivation, such as outlined in the Shock Vibration Handbook, (page 7-37), supra. However, a simpler approximation for $L_e$ can be made on the basis that the length of a tab section or sections is small compared to the rest of the beam, which value of $L_e$ can then be used in the calculation of resonant frequency by use of equations (1) and (2).

For a beam of non-constant transverse cross section, as for example, a beam of uniform cross section over a major span L of the beam and a uniform different cross section over a shorter span $L_s$, the ratio of fundamental resonant frequency of the beam with tab $f_t$ to fundamental frequency of the beam without tab $f_b$ can be approximated as:

$$R = \frac{f_b}{f_t} = \left[ 1 + \frac{I}{I_s} \left( \frac{L_s^4}{L_1^4} + 4\frac{L_s^3}{L_1^3} + 6\frac{L_s^2}{L_1^2} + 4\frac{L_s}{L_1} \right) \right]^{\frac{1}{2}}$$

and also
$L_e = R^{\frac{1}{2}} L_1$
and
 $L_1$ = length of the major span of the beam;
 $L_s$ = length of the short span of the beam;
 I = moment of inertia modulus for the major span $L_1$ of the beam in the direction of vibration;
 $I_s$ = moment of inertia of the smaller length of the beam in the direction of vibration;
 $L_e$ = length of an equivalent beam with a uniform moment of inertia = I from end to end.

Also, sensitivity for a beam with tab can be expressed as $$Se = \left( 1 + \frac{FL_e^2}{4EI\pi^2 n^2} \right)^{\frac{1}{2}} - 1, \text{ where}$$

$S_e$ is the sensitivity of an equivalent beam of length $L_e$ and width w.

For normal operation, a beam is designed to vibrate in one direction only. However, if an applied force causes the resonant frequency in one direction to be equal to the fundamental frequency or a harmonic of the fundamental frequency in another direction, then vibration of the beam will occur in two planes at once. When this happens, the energy losses due to vibration will increase because of the extra mode of vibration. This phenomenon manifests itself as an overall reduction of the quality factor "Q" of the vibrating beam which causes an undesired frequency shift or possible cessation of oscillations depending on the electrical oscillator circuit and its ability to absorb this change in "Q". A round beam element of circular cross section which is symmetrical in all directions would not exhibit this characteristic since multiplane oscillations would always exist in the same ratio independent of force and accordingly, is an unsatisfactory design since its "Q" in a single direction would always remain uniformly low. This limitation of a round beam, however, could be overcome by the use of a tab section to make its resonant frequency a function of direction of vibration.

In a vibrating beam transducer, for a transverse vibration of the beam in the plane or direction of width w, the sensitivity of the transducer is reduced approximately as the 3/2 power of the value of w whereas it varies only inversely proportional to the ½ power of beam thickness t. However, in manufacture of a beam by the photo-etch process, it becomes impractical to make w much less than t. Since L is the same value for both vibration modes of a beam, the avoidance of spurious vibration modes due to a varying force F or to manufacturing tolerance can only be achieved by increasing w to be greater than t but with the associated disadvantage of a correspondingly lower sensitivity. The force sensitivity, however, remains high for vibrations in the direction of t so that the separation of resonances must be made large to avoid the higher sensitivity mode overtaking the lower sensitivity resonance value due to an applied force. This results in an overall reduced sensitivity of the design. By contrast, a beam of square cross section has the same sensitivity in both directions and the relationship between transverse and normal resonances is independent of applied axial force. The addition of a tab will change the sensitivity ratio but not to the extent that occurs on changing beam width.

A standard single beam transducer 10 comprising a beam 11 is shown in FIG. 1. The beam 11 is adapted to be vibrated at its natural resonant frequency by electrical excitation. For quartz elements, this drive is accomplished by means of the piezoelectric effect whereas metal beams are driven electromagnetically as by an application of A.C. signals from an oscillator 12 with the beam disposed in a magnetic field, as between the poles of a permanent magnet (not shown). The oscillator 12 follows in frequency, the frequency of the transducer so the change in frequency of the transducer can be measured by the output frequency of the oscillator.

Figure 2:
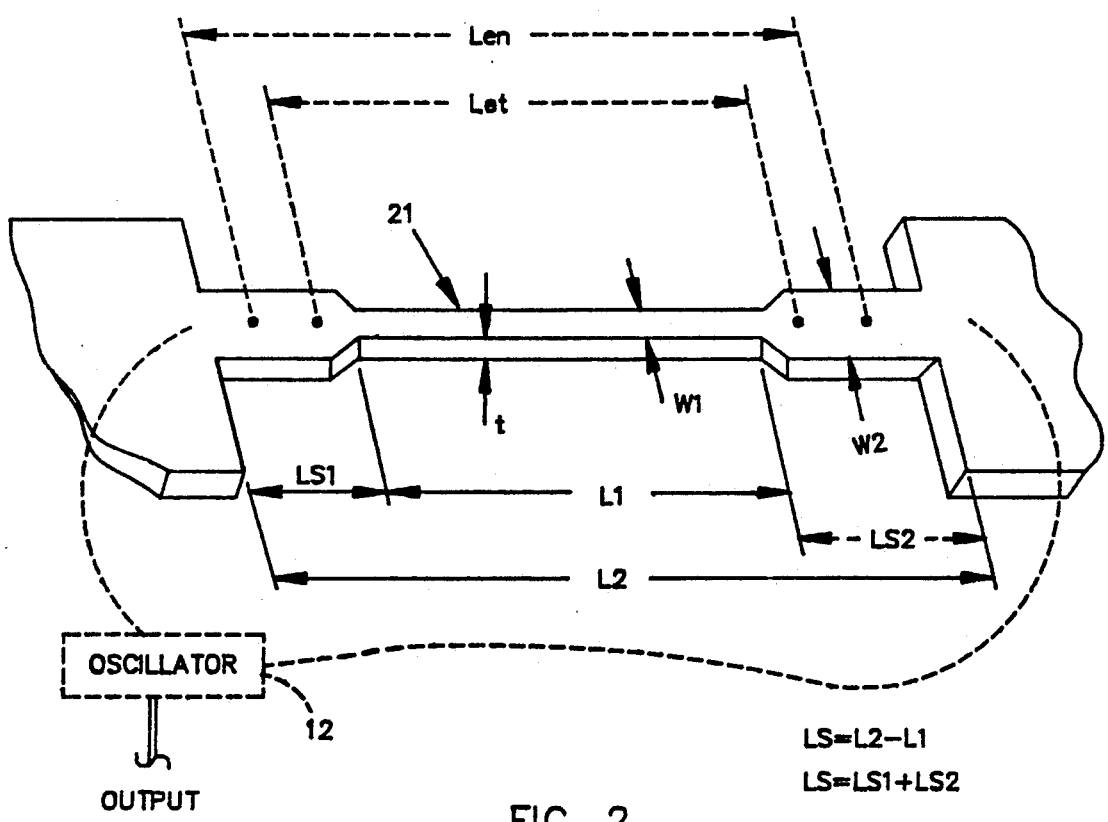
FIG. 2 is a perspective view of a single beam resonant transducer which is made in accordance with the principles of the present invention.

For a standard single beam transducer 10, as shown in FIG. 1, the thickness t and width w of the beam 11 are the only variables dimensions that can be varied to achieve an adequate separation or avoidance of directional resonances. However, by designing a vibrating beam 21 (see FIG. 2) with a major span section of uniform cross section width $w_1$ and length $L_1$ with tabs on either or both ends thereof, with respective lengths of $L_{s1}$ and $L_{s2}$ and a total length $L_s$, to provide a total beam length $L_2$, the introduction of a new design parameter $L_{1e}$ which represents an effective length for the beam section of length $L_1$ is permitted. Such $L_{1e}$ is not the length $L_1$ as shown in FIG. 2 but represents, instead, the value of an effective length $L_e$ as defined previously. By an appropriate choice of dimensions, t, $w_1$, $L_1$ and $L_s$, it is therefore possible to achieve a much larger range of frequency sensitivity "S" for a given length of beam, than can be obtained for a vibratory beam of the same given length without the tabs. This is because the directional sensitivity values can be more closely matched than for a beam with no tabs to avoid spurious modes.

The selection process described above can be shown to be appropriate for both a single beam and a double beam transducer, which is essentially a transducer having two single vibratory beams in parallel arrangement and connected together at their adjacent ends.

As to avoiding the development of spurious modes of vibration and the resulting energy losses, it has been observed that there are as many spurious modes of vibration as there are directions of non-symmetry. The two most important spurious modes are (1) vibration of the beams in a direction perpendicular to the normal operational mode and in 180 degree out of phase relationship to one another and (2) vibration of the beams in phase and in a direction perpendicular to the normal operational mode. It has been shown in the prior art, as in U.S. Pat. No. 4,372,173, that another length dimension can be introduced to the double beam resonator to design to avoid the second spurious mode noted above. However, the proposed design in the prior art does nothing for avoiding the development of spurious mode (1) above except for a choice of t and w that is detrimental to sensitivity or to manufacture by photoetching.

A mismatch in dimensions of beams and a consequent mismatch in their resonant frequencies can also occur due to an uneven temperature distribution to the beams owing to temperature gradients introduced into the sensor during changing ambient temperature conditions. If the beams are not at the same temperature, their resulting expansions will be unequal and their unequal lengths can result in unequal force splitting of an applied load unless provision is made to compensate by allowing the rotation of the beams support.

Figure 3:
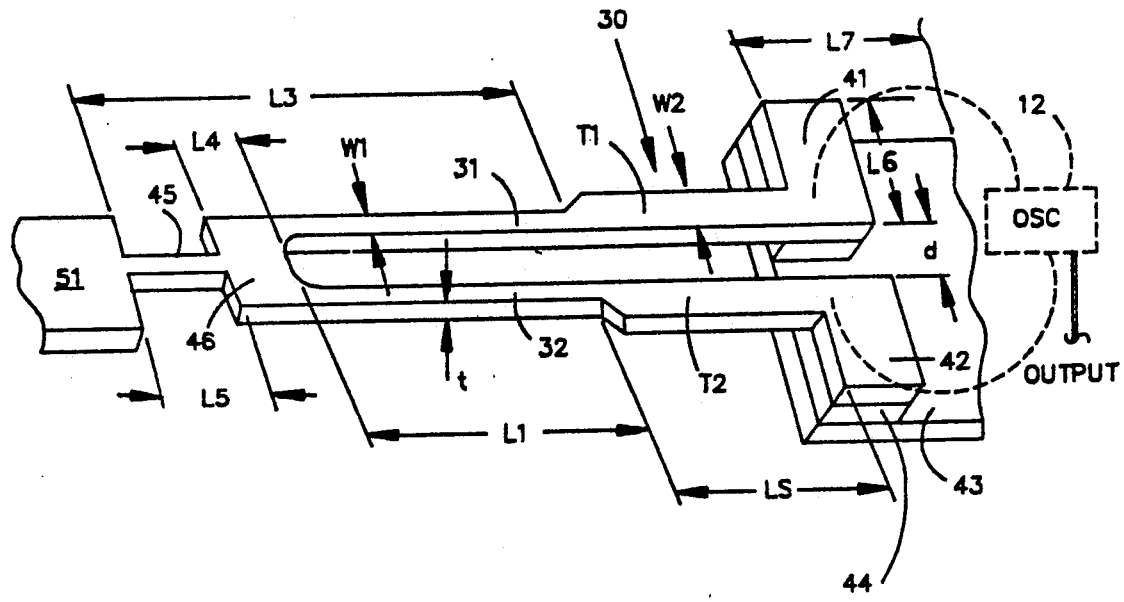
FIG. 3 is a view in perspective of a double beam resonant transducer made in accordance with the principles of the invention wherein the beams are coupled at one end and a moment decoupling member is incorporated for compensating for potential length, mismatch of the beams due to unequal temperature distribution or applied load moments.

A structure for a double beam vibratory transducer which addresses all the problems noted above is shown in FIG. 3. The double beam transducer 30 shown therein is a metallic structure comprised of a pair of parallel beams 31 and 32 of rectangular cross section which are coupled together at one end. From their junction, the beams 31,32 extend an equal length $L_1$ over a major span of the beam to widened tab portions $T_1$ and $T_2$ respectively, each of which is of a length $L_s$. Each beam, over its major span $L_1$ is provided with a thickness t and width $w_1$ and is uniformly spaced from the adjacent beam by a distance d. The ends of the tab portions remote from the junction of the beams are integrally joined to much wider mass portions 41,42 respectively, which are adapted for mounting atop a metal base support 43 and insulated therefrom by electrical insulating material 44. For beams constructed of an electrical insulating material, mass portions 41 and 42 are joined together to form a single wider section for the purpose of isolating vibration from the mounting support structure 43. Accordingly, for each beam an effective length $L_e$ is the determining length for the primary resonant frequency at which the beams are adapted to be vibrated in the same plane in a direction transverse to their length $L_1$ and in opposite phase relation to one another. The criteria for designing each beam with an effective length $L_e$ as previously defined are also available to design the transducer 30 so as to offset a spurious frequency of vibration in mode (1). The dimensions $L_1$ and $L_s$ can therefore be selected to provide an effective length as earlier described.

For metal beams, the beams are driven by an application of A.C. signals from an oscillator 12 with both beams disposed in a magnetic field as between the poles of a permanent magnet (not shown).

For the purpose of avoiding a spurious frequency vibration in mode (2), an effective length $L_e$ can be determined for the beams over the total length as measured from the end of the coupling member 45 at its junction with a widened end mass portion 51 to the end of the beams at their junction with the masses 41,42. $L_3$ is the length from the end of the coupling member 45 at end portion 51 to the tab section $T_1$ and $T_2$. The widened end portion 51 is available to be superposed and mounted atop and insulated from an appropriate support structure (not shown). The effective length over the total actual length can be determined from $L_s$ and $L_3$ and the included moments of inertia in the same manner for determining an effective length as previously stated.

It is to be noted that it is not required that the tab sections be symmetrical and the beams may be formed with a tab section at only one or both ends. $L_s$ represents the total tab length per beam.

In addition to the criteria for a double beam transducer as described above, it is also important to consider the criteria for determining the dimension d and its relationship to $w_4$ and $w_5$ where $w_4$ is the width of the common-joined section 46 of the beams and $w_5$ is the width of coupling member 45. In this respect, distance d must be chosen to be large enough so that the tolerance required to place section 46 acceptably close symmetrically to the longitudinal centerline is within the capability of the fabrication process.

The distance d must also be chosen small enough so that efficient coupling occurs between the beams.

Length $L_5$ of coupling member 45 must be chosen in relationship to d so that any anticipated moment from the mounting structure does not result in an intolerable force mismatch between the beams.

$L_5$ must also be chosen in conjunction with the other dimensions previously stated to avoid spurious resonances in mode (2).

Length $L_4$ of common section 46 must be chosen in relation to d so that length mismatch of the beams due to uneven temperature distribution or fabrication does not unacceptably effect the force mismatch between the beams. When $L_4$ is properly chosen and $L_5$ is relatively short as compared to $L_1$, the effect of mass introduced by the common section of length $L_4$ on the calculations to avoid spurious mode (2) vibration is small because the mass is close to the end of the vibrating structural element.

Figures 4, 5:
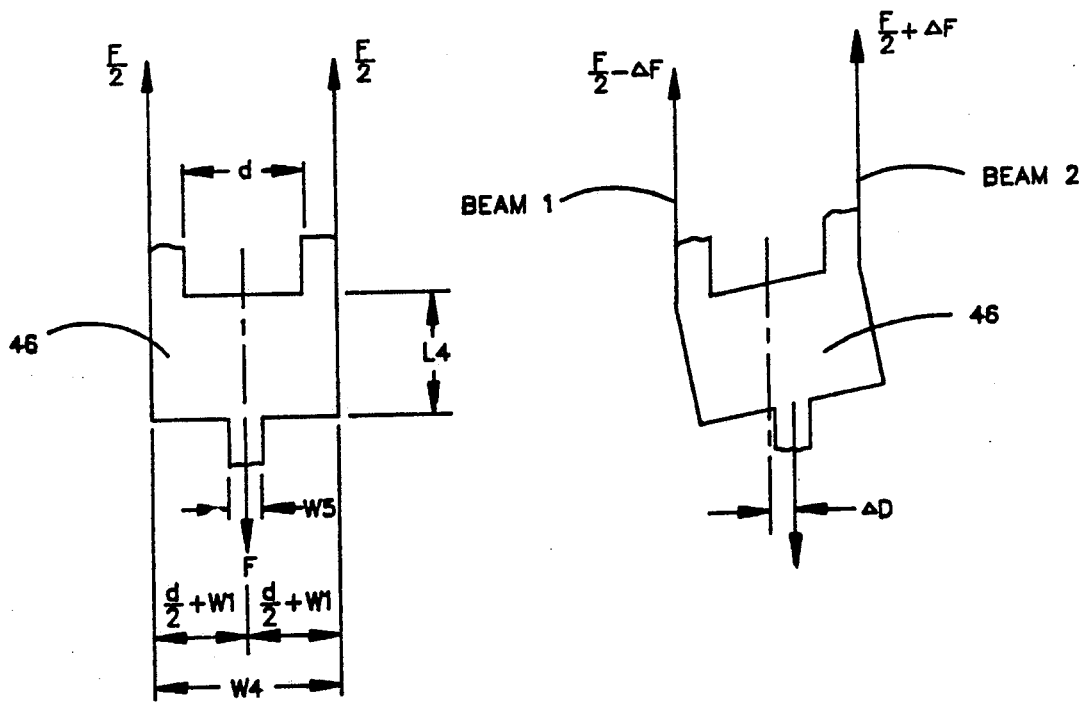
FIG. 4 is a schematic diagram of applied forces on a common section of the beams at their joined ends as shown in FIG. 3 to illustrate relationship of the length $L_4$ of the common section to the spacing d between the parallel beams.
FIG. 5 is a view similar to FIG. 4 but showing a change $\Delta L$ in the length of one of the beams and its effect on the point of application of a force $\Delta F$.

In FIGS. 4 and 5 of the drawings, there is shown the relationship which exists between $L_4$ and d and the resulting effect when a tension force F is applied to the section 46 of length $L_4$. A change $\Delta L$ in the length of one of the beams as shown in FIG. 5 will cause a change $\Delta D$ in the point of application of force due to the rotation of the element 46. This change results in an increased force ($+\Delta f$) on the shorter beam and a decrease in the load ($-\Delta f$) on the longer beam. This mismatch only serves to aggravate the resonant frequency change due to the shorter length in the beam. Also, the magnitude of this effect is determined by the length relationship of $L_4$ to d. Thus, a smaller dimension for $L_4$ reduces the effect while a smaller dimension for d increases the effect.

$L_3$ must be chosen so that Leff for the spurious mode of vibration perpendicular to the normal mode but with both beams in phase does not produce higher harmonic modes equal to the primary frequency. $L_s$ must be chosen to avoid the same condition when the spurious mode consists of the beams out of phase.

$L_4$ must also be chosen to be large enough so that insignificant flexure occurs in this section 46 in relationship to the stretch of the beams due to the application of the modulation force.

The width dimension $L_6$ of each mass section 41,42 is chosen to be large enough so that the increase in the moment of inertia for this mounting tab allows the variations in mounting attachment point to cause insignificant effective length variations for the primary resonant length $L_1$. It is to be noted that coupling of the beams to each other at this end is provided by the structure 43 on which the sections 41 and 42 are to be mounted.

A length $L_7$ of the mounting structure 43 is chosen sufficiently long to also effectively isolate vibrational energy from the mounting structure by providing an isolated section to allow the cancellation of equal and opposite beam reactions from the two beams without coupling to the mounting structure due to elastic deformations caused by the beam reactions.

When all dimensions are chosen correctly length $L_5$ of coupling member 45 will effectively isolate any vibrating reaction forces of the beams from the mounting structure and thus assure a high "Q" for the transducer.

Typical values for a dual beam transducer fabricated in accordance with the invention are as follows:

| | |
|---|---|
| $L_1 = .400''$ | $L_7 = .125''$ |
| $L_2 = .110''$ | $t = .0040 \pm .0003''$ |
| $L_3 = .470''$ | $W_1 = .0043 \pm .0006''$ (True rectangular section) |
| $L_4 = .030''$ | $W_2 = .010''$ |
| $L_5 = .040''$ | $d = .020''$ |
| $L_6 = .050''$ | F(Range) = .05-.55 LBS per side |

Figure 6:
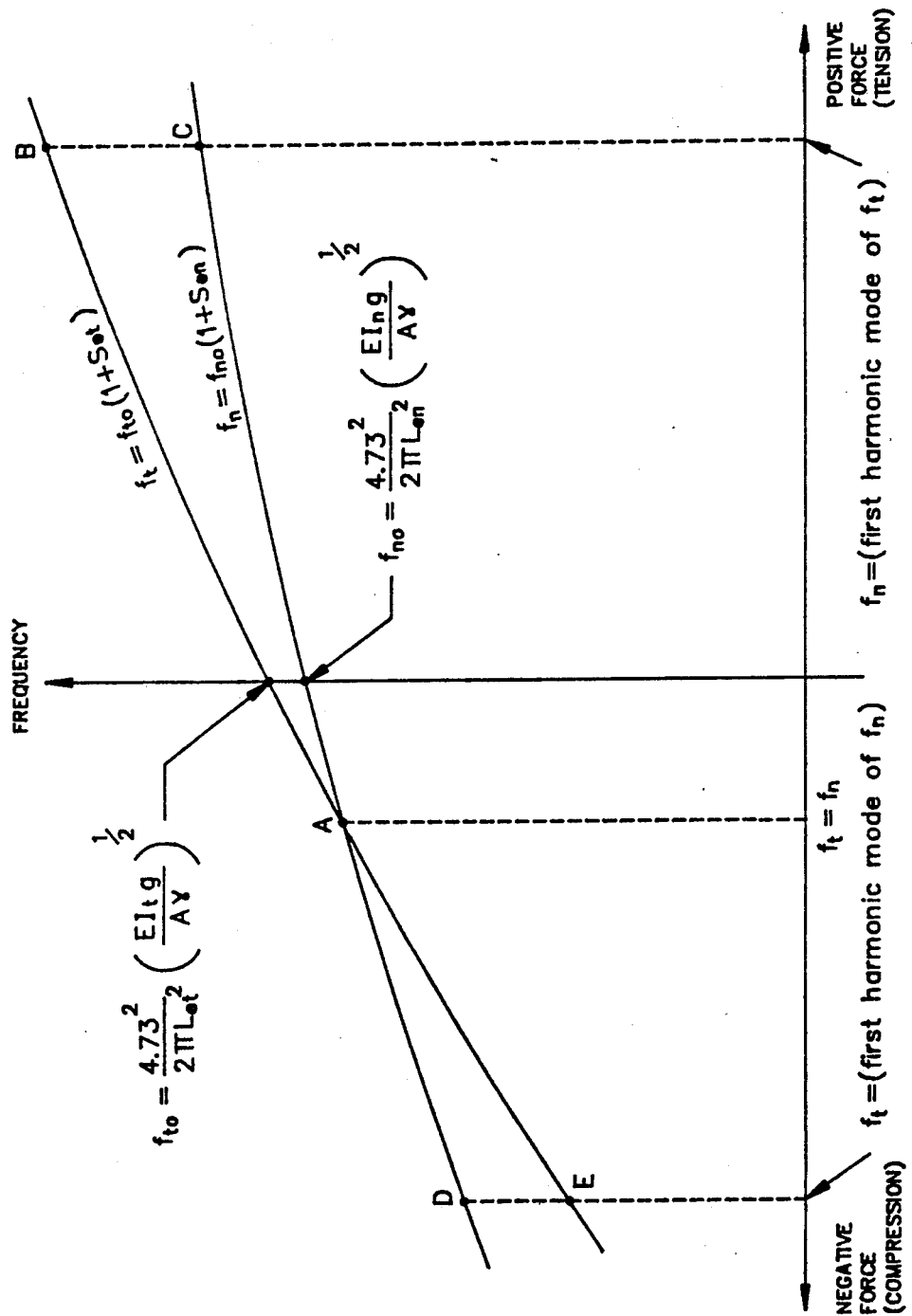
FIG. 6 is a graph showing the relationship of applied force versus resonant frequency through an acceptable operational range of forces for beams of given dimensions and effective sensitivity when vibrating in a desired transverse direction and when vibrating in a direction perpendicular thereto.

FIG. 6 is a graph showing the relationship of applied force versus natural resonant frequency through a range of force applied to a beam of given dimensions and effective sensitivity. The graph shows the plot of a first curve $f_t = f_{to}(1 + S_{et})$ where $f_t$ = transverse vibration frequency in the direction of the width dimension, $f_{to}$ = vibration frequency with zero load in the transverse direction, and $S_{et}$ = effective sensitivity in the transverse direction of vibration parallel to w. The graph also includes the plot of a second curve $f_n = f_{no}(1 + S_{en})$ where $f_n$ = vibration frequency in a direction normal to the transverse direction, $f_{no}$ = vibration frequency in the direction normal to the transverse direction with zero load applied, and $S_{en}$ = effective sensitivity in said normal direction. Point A on the graph indicates a value of applied tension force where $f_t = f_n$. Points B and C indicate values of applied tensile force for which the first mode harmonic frequency occurs at point B that is, where $f_n$ = first mode harmonic of $f_t$. The abscissa for the point A and the common abscissa for points B and C define the limits of an acceptable range of forces for operation as a resonant transducer. Also, another acceptable range of operation is defined by points D and E and point A. When $f_t = f_n$, $$\left(\frac{L_{en}}{L_{et}}\right)^2 \left(\frac{I_t}{I_n}\right)^{\frac{1}{2}} \left(\frac{1 + S_{et}}{1 + S_{en}}\right) = 1.$$

When $f_n$ = first harmonic mode of $f_t$, $$\left(\frac{7.853}{4.73}\right)^2 \left(\frac{L_{en}}{L_{et}}\right)^2 \left(\frac{I_t}{I_n}\right)^{\frac{1}{2}} \left(\frac{1 + S_{et(1)}}{1 + S_{en}}\right) = 1$$

As the beam dimensions are changed, the slopes of curves for $f_t$ and $f_n$ are altered and the points A and B, C will move toward or away from one another. $S_{et1}$ = effective sensitivity of harmonic mode 1 in transverse direction. The beam dimensions to be selected then define a range of usable force values that do not include a cross-over point for the curves for $f_t$ and $f_n$ and fall within the range limited by points A,B,C but not including points A,B,C or fall within the range limited by points A,D,E but not including A,D,and E.

It will therefore be seen that a unique force responsive vibratory beam transducer is disclosed herein wherein the vibratory beam or beams are provided with end tabs and specific design criteria which allows the fabrication of either single beam or double-beam transducers which will avoid the development of undesirable spurious modes of oscillation in the direction perpendicular to the normal transverse vibrations of the beams. The provision of tabs solves spurious mode problems when, with conventional fabrication processes, it becomes impractical to design a beam with width w much less than its thickness t. The criteria, herein specified which allow a high degree of sensitivity and dimensions t = w, will avoid a spurious mode wherein the beans are vibrating out of phase in the direction perpendicular to transverse and also a spurious mode wherein the beams are vibrating in phase in the perpendicular direction. The beams are designed to work in tension or compression and are preferably of metallic material but could be fabricated from other materials including piezoelectric.

It is also to be noted that in the fabrication of beam transducers of small dimensions by means of a photo-etching process, particularly where the width dimension w of a beam approaches or equals the thickness dimension t, the process tends to produce cross sections of non-symmetrical hexagon shape rather than rectangular or square with the consequence that the moment of inertia of the beam for two different directions is not accurately defined by w and t. The addition of tabs to a beam, wherein w is larger than t, introduces a better defined parameter for controlling the ratio of resonant frequencies for the beam in two different directions.

It is also to be understood that the foregoing description of a preferred embodiment of the invention has been presented for purposes of illustration and description and is not intended to limit the invention to the precise form disclosed. For example, the tab sections do not have to be symmetrical with respect to the central longitudinal axis of the transducer and the transverse cross section of a beam is possible wherein t = w. It is to be appreciated therefore that various material and structural changes may be made by those skilled in the art without departing from the spirit of the invention.

I claim:

1. A vibratory force transducer comprising an elongate vibratory beam which is approximately rectangular in transverse cross section and characterized by a uniform thickness dimension t, a major span section having a length dimension $L_1$ and a width dimension $w_1$ in transverse cross section, and at least one end of said major span section terminating with a tab section which has a greater width dimension $W_2$ than said major span section and a length $L_s < L_1$, said tab section providing said vibratory beam portion with an effective length $L_e = R\, L_1$, where $$R = \frac{f_b}{f_t} = \left[1 + \frac{I}{I_s}\left(\frac{L_s^4}{L_1^4} + 4\frac{L_s^3}{L_1^3} + 6\frac{L_s^2}{L_1^2} + 4\frac{L_s}{L_1}\right)\right]^{\frac{1}{4}}$$

$f_t$ = fundamental resonant frequency of the beam with tab and $f_b$ = fundamental frequency of the beam of equal dimensions without a tab, said beam being adapted to be driven by electrical excitation to resonate at a frequency $f_1$ in a given direction of the beam, I = the moment of inertia of said major section of the beam in said given direction of vibration, $I_s$ = the moment of inertia of the tab section of the beam in said given direction of vibration and wherein the values of t, $w_1$, $w_2$, $L_1$ and $L_s$ are selected to avoid spurious modes of oscillation such that the resonant frequency and higher harmonic modes of $f_1$ is different from the natural resonant frequency and higher harmonic modes of the beam in any other direction and avoids spurious modes of beam vibration in said other directions.

2. A vibratory force transducer as set forth in claim 1 further including means for driving said beam by electrical excitation to vibrate at the resonant frequency $f_1$ in said given direction of vibration of the beam and wherein said beam is adapted to be subjected to axially applied forces in a range of forces which induce a change in said resonant frequency $f_1$ as a function of the applied force.

3. A vibratory beam transducer comprising an elongate vibratory beam as set forth in claim 1 wherein t and $w_1$ are selected such that $t = w_1$.

4. A vibratory force transducer as set forth in claim 1 wherein said vibratory beam is provided with a pair of equally dimensioned tab sections, one at each end of the major span section.

5. A vibratory force transducer comprising a pair of elongate vibratory beams arranged in parallel relationship and coupled together at one pair of adjacent ends, said beams each being approximately rectangular in transverse cross section and characterized by a uniform thickness t, a major span section having a length $L_1$, a width $w_1$ in transverse cross section, and one end of said major span section having a tab section of width $w_2$ formed integrally thereto remote from said coupled adjacent ends and extending in the longitudinal axial direction of said major span section to provide said vibratory beam with an effective length $L_e = R^{\frac{1}{4}} L1$ and $$R = \frac{f_b}{f_t} = \left[ 1 + \frac{I}{I_s} \left( \frac{L_s^4}{L_1^4} + 4\frac{L_s^3}{L_1^3} + 6\frac{L_s^2}{L_1^2} + 4\frac{L_s}{L_1} \right) \right]^{\frac{1}{4}}$$

where $f_t$ = fundamental resonant frequency of the beam with tab and $f_b$ = fundamental frequency of the beam of equal dimensions without a tab, $L_s$ = the length of a tab section, I = the moment of inertia of said major section of the beam in a given direction of vibration, $I_s$ = the moment of inertia of a tab section of the beam in said given direction of vibration, said beams being adapted to be driven by electrical excitation to resonate in phase opposition at a frequency $f_1$ in a given transverse direction and to be subjected to an axially applied force in a range of forces which induce a change in the resonant frequency as a function of the applied force, and wherein t, $w_1$, $w_2$, $L_1$ and $L_s$ are selected to avoid spurious modes of out-of-phase oscillation in a direction perpendicular to said given direction such that the resonant frequency $f_1$ and higher harmonic modes of each beam in said given direction is different from the natural frequency and higher harmonics of the beams in any other direction and avoids spurious modes of beam vibration in other directions than said given direction during an application of an axially directed force within said range of forces.

6. A vibratory force transducer as set forth in claim 5 further including means for driving said beams by electrical excitation to resonate in phase opposition at said frequency $f_1$ in said given transverse direction.

7. A vibratory force transducer comprising a pair of elongate vibratory beams arranged in parallel relationship about an axis of symmetry and coupled together at one pair of adjacent ends, said beams each being approximately rectangular in transverse cross section and characterized by a uniform thickness t, a major span section having a length $L_1$, a width $w_1$ in transverse cross section, and one end of said major span section having a tab section of width $w_2$ formed integrally thereto remote from said coupled adjacent ends and extending in the longitudinal axial direction of said major span section, a moment decoupling member formed integrally to the coupled end of said beams and extending coaxial with said axis of symmetry, said tab sections providing said transducer with an effective length $L_e = R^{\frac{1}{4}} L1$ where $$R = \frac{f_b}{f_t} = \left[ 1 + \frac{I}{I_s} \left( \frac{L_s^4}{L_1^4} + 4\frac{L_s^3}{L_1^3} + 6\frac{L_s^2}{L_1^2} + 4\frac{L_s}{L_1} \right) \right]^{\frac{1}{4}}$$

$f_t$ = fundamental resonant frequency of the beam with tab in a given transverse direction and $f_b$ = fundamental frequency of the beam of equal dimensions without a tab, where $L_3$ = the length measured from the tab sections to the remote end of said coupling member, I = the moment of inertia of the transducer portion of length $L_3$, $I_s$ = the moment of inertia of the tab sections of length $L_s$ and wherein t, $w_1$, $w_2$, $L_3$ and $L_s$ are further selected to avoid spurious modes of in-phase oscillation of the beams in a direction normal to the given direction such that the resonant frequency and higher harmonics in said given direction is different from the natural frequency and higher harmonics of the beams in any other direction and avoids spurious modes of beam vibration in other directions than said given direction.

8. A vibratory force transducer as set forth in claim 7 further including means for driving said pair of beams by electrical excitation to vibrate at a resonant frequency in a given direction of vibration and in 180° out-of-phase relation.

9. A vibratory force transducer comprising an elongate vibratory beam which is approximately rectangular in transverse cross section and characterized by a uniform thickness dimension t, and a major span section having a length dimension $L_1$, and a width dimension $w_1$ in transverse cross section, said beam being adapted to be driven by electrical excitation at resonant frequency in a given transverse direction and to be subjected to axially applied forces F in a range of forces which induce a change in said resonant frequency as a function of the applied force;

a tab section adjoining said major span section at one end thereof and integrally formed therewith and having a length $L_s$ and width $w_2$, said tab section having dimensions of length $L_s < L_1$ and width $w_2 > W_1$, and providing said vibratory beam with an effective sensitivity $S_e$ and effective length $L_e = R^{\frac{1}{4}} L_1$ where $$R = \left[ 1 + \frac{I}{I_s} \left( \frac{L_s^4}{L_1^4} + 4\frac{L_s^3}{L_1^3} + 6\frac{L_s^2}{L_1^2} + 4\frac{L_s}{L_1} \right) \right]^{\frac{1}{4}}$$

I = moment of inertia modulus for the major span of the beam in the direction of vibration;
$I_s$ = moment of inertia of the tab section of the beam in the direction of vibration;
$L_e$ = length of an equivalent beam with a uniform moment of inertia from end to end;

$$S_e = \left( 1 + \frac{FL_e^2}{4EI\pi^2 n^2} \right)^{\frac{1}{2}} - 1 \text{ where}$$

E = modulus of elasticity of the beam;

n = harmonic member and the resonant frequency of said vibratory beam in said given transverse direction varies in accordance with applied axial forces as the function $f_t = f_{to}(1 + S_{et}(1))$ where $f_t$ = resonant frequency of the beam in the given transverse direction, $f_{to}$ = resonant frequency of the beam in given transverse direction with zero load applied in the axial direction, and $S_{et}$ = effective sensitivity of the beam in the given transverse direction;

and the resonant frequency of said vibratory beam in any direction other than said given transverse direction varies in accordance with applied axial forces as $$f_n = f_{no}(1 + S_{en}) \qquad (2)$$

where $f_n$ = resonant frequency of the beam in said other direction $f_{no}$ = resonant frequency of the beam in said other direction with zero load applied in the axial direction, and $S_{en}$ = effective sensitivity in said given other direction;

said beam dimensions t, $L_1$, $w_1$, $L_s$, $w_2$ being selected to define a range of usable force values for said applied forces that do not include a crossover point for the curves defined by equations (1) and (2) and do not include harmonic multiples of curves (1) and (2).

10. A vibratory transducer as set forth in claim 9 further including means for driving said beam by electrical excitation to vibrate at the resonant frequency in said given transverse direction.

11. A vibratory force transducer comprising a pair of elongate vibratory beams arranged in parallel relationship and coupled together at a pair of adjacent ends of said beams, each said beam being rectangular in transverse cross section and characterized by a uniform thickness dimension t and a major span section having a length dimension $L_1$ and a width dimension $w_1$ in transverse cross section wherein $w_1 = t$, said beams being adapted to be driven by electrical excitation in out-of-phase resonant frequency in a given transverse direction and to be subjected to axially applied forces in a range of forces which induce a change in said resonant frequency as a function of the applied force; and each said beam having a tab section adjoining its major span section at one end thereof and integrally formed therewith, said tab section being provided with dimensions of length $L_s < L_1$ and a width $w_2 < w_1$ and wherein t, $w_1$, $w_2$, $L_1$ and $L_s$ are selected such that the resonant frequency and higher harmonic modes of the beams in said given direction is different from the natural resonant frequency and higher harmonic modes of the beams in any other direction and avoids spurious modes of beam vibration in other directions than said given direction during an application of an axially directed force within said range of forces.

* * * * *